United States Patent
Hala et al.

(10) Patent No.: US 9,215,789 B1
(45) Date of Patent: Dec. 15, 2015

(54) HYBRID PLASMA SOURCE

(71) Applicant: King Abdulaziz City for Science and Technology, Riyadh (SA)

(72) Inventors: Ahmed M. Hala, Riyadh (SA); Lutfi Oksuz, Isparta (TR)

(73) Assignee: KING ABDULAZIZ CITY FOR SCIENCE AND TECHNOLOGY, Riyadh (SA)

(*) Notice: Subject to any disclaimer, the term of this patent is extended or adjusted under 35 U.S.C. 154(b) by 9 days.

(21) Appl. No.: 14/282,361

(22) Filed: May 20, 2014

(51) Int. Cl.
*H05H 13/00* (2006.01)
*H05H 1/46* (2006.01)
*H01J 37/32* (2006.01)
*H01J 37/18* (2006.01)
*H01J 37/244* (2006.01)

(52) U.S. Cl.
CPC *H05H 1/46* (2013.01); *H01J 37/18* (2013.01); *H01J 37/244* (2013.01); *H01J 37/3211* (2013.01); *H01J 37/3244* (2013.01); *H01J 37/32183* (2013.01); *H01J 37/32201* (2013.01); *H01J 37/32256* (2013.01); *H01J 37/32669* (2013.01); *H01J 37/32678* (2013.01); *H05H 2001/4607* (2013.01); *H05H 2001/4667* (2013.01)

(58) Field of Classification Search
CPC .................. H01J 37/32; H05H 13/00
USPC ............. 315/500, 501, 502, 34, 39.51, 39.57
See application file for complete search history.

(56) References Cited

U.S. PATENT DOCUMENTS

| | | | |
|---|---|---|---|
| 5,133,826 A | 7/1992 | Dandl | |
| 5,686,796 A | 11/1997 | Boswell et al. | |
| 6,541,729 B2 | 4/2003 | Siniaguine | |
| 7,589,470 B2 | 9/2009 | Oksuz | |
| 8,128,783 B2 | 3/2012 | Matsuuchi et al. | |
| 8,179,050 B2 | 5/2012 | Chen | |
| 8,214,173 B2 | 7/2012 | Takizawa | |
| 8,349,412 B2 | 1/2013 | Cabarrocas et al. | |
| 8,461,761 B2 | 6/2013 | Neate | |
| 8,890,410 B2 * | 11/2014 | Ikeda | H05H 1/46 118/723 MW |
| 2003/0234369 A1 | 12/2003 | Glukhoy | |
| 2008/0246406 A1 * | 10/2008 | Chen | H01J 37/32082 315/111.41 |

OTHER PUBLICATIONS

Scharer Research Group, "Helicon Plasmas", http://legolas.ece.wisc.edu/helicon.php, 2007; 4 Pages.

* cited by examiner

*Primary Examiner* — Minh D A
(74) *Attorney, Agent, or Firm* — Andrew M. Calderon; Roberts Mlotkowski Safran & Cole, PC

(57) ABSTRACT

Systems and methods for generating plasma are disclosed. A system for generating a plasma includes a helicon plasma source and an electron cyclotron resonance (ECR) plasma source structured and arranged together to generate a plasma in a tube.

18 Claims, 2 Drawing Sheets they produce plasma with a very high density at a relatively high pressure and low electron temperature.

HYBRID PLASMA SOURCE

FIELD OF THE INVENTION

The invention relates to plasma generation and, more particularly, to a hybrid plasma source.

BACKGROUND OF THE INVENTION

Plasmas that are used in industry are commonly generated by ionizing a gas in a vacuum chamber. For example, a gas can be introduced into an evacuated plasma chamber where the work-piece is located. A strong electric field can be applied to the plasma chamber. The gas can form a plasma in an excitation region by undergoing an electrical breakdown under the influence of the strong electric field.

The electric field in such chambers is typically either capacitively or inductively coupled to the gas to remove electrons therefrom. In capacitively coupled plasma generators, the electric field can be applied between electrodes on opposing sides of the chamber. In inductively coupled plasma generators, the electric field can be applied to a coil surrounding the chamber, as but one example.

Plasma tools are commonly used in the fabrication of semiconductor devices. For example, plasmas are used to deposit materials on and etch materials from work-pieces to form specific electronic components on the work-piece substrate. However, many plasma tools in the semiconductor industry suffer from relative low density and unstable working conditions.

SUMMARY OF THE INVENTION

In a first aspect of the invention, there is a system for generating a plasma including a helicon plasma source and an electron cyclotron resonance (ECR) plasma source structured and arranged together to generate a plasma in a tube.

In another aspect of the invention, there is a system for generating a plasma. The system includes a helicon plasma source comprising an RF antenna wrapped around a tube and an RF source that provides energy to the RF antenna. The system also includes an electron cyclotron resonance (ECR) plasma source comprising a microwave power source, a circulator, a load, a stub tuner, and a horn arranged at a first end of the tube. The system further includes a gas inlet and a vacuum port at a second end of the tube. The system additionally includes a magnet array that generates a magnetic field inside the tube. The RF antenna is wrapped around a first middle portion of the tube between the first end and the second end. The magnet array is at a second middle portion of the tube between the first end and the second end. The gas inlet is fluidically connected to a gas source that provides a neutral gas to an interior of the tube. The vacuum port is connected to a vacuum source that provides a vacuum to the interior of the tube. Plasma is generated from the neutral gas in the tube using energy from both the RF antenna and the microwave power source.

In yet another aspect of the invention, there is a method of generating a plasma comprising: providing a helicon plasma source comprising RF antenna wrapped around a tube and an RF source that provides energy to the RF antenna; providing an electron cyclotron resonance (ECR) plasma source comprising a microwave power source, a circulator, a load, a stub tuner, and a horn arranged at a first end of the tube; providing a magnet array that generates a magnetic field inside the tube; and generating a plasma in the tube using energy from both the RF antenna and the microwave power source.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The invention relates to plasma generation and, more particularly, to a hybrid plasma source. Many plasma tools in the semiconductor industry suffer from relative low density and unstable working conditions. Aspects of the invention involve combining two plasma source generation techniques to give a higher density, more stable plasma source than is provided from a single source alone. In embodiments, a hybrid plasma source includes a helicon source system combined with an Electron Cyclotron Resonance (ECR). In this manner, implementations of the invention provide a system that generates plasma with a very high density at a relatively high pressure and low electron temperature.

Electron Cyclotron Resonance (ECR) is a phenomenon observed in plasma physics. An ionized plasma may be efficiently produced or heated by superimposing a static magnetic field and a high-frequency electromagnetic field at the electron cyclotron resonance frequency. A helicon discharge is an excitation of plasma by helicon waves induced through radio frequency heating. Implementations described herein utilize both a ECR component and a helicon component together to generate a plasma.

Figure 1:
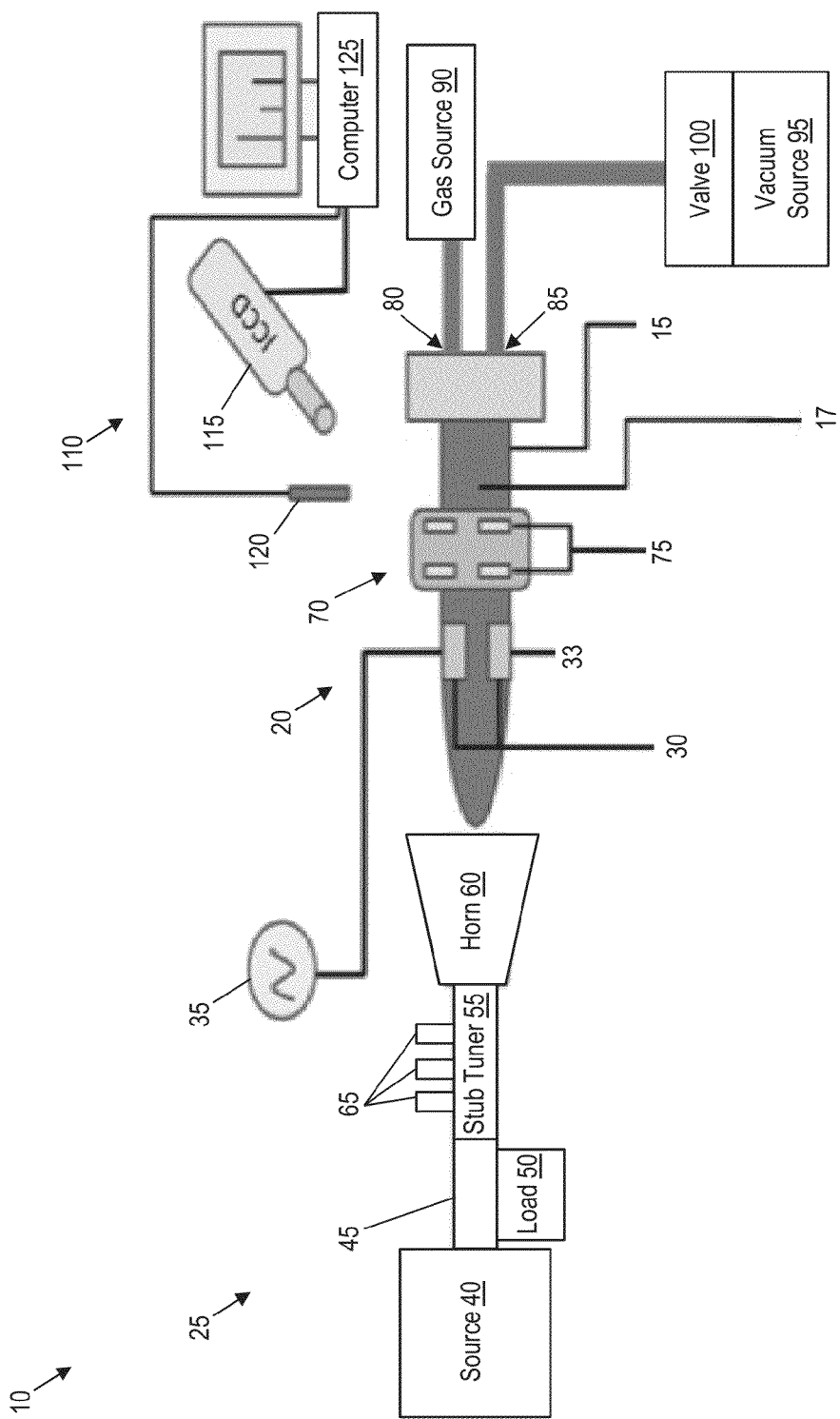
FIG. 1 shows a block diagram of a hybrid plasma source in accordance with aspects of the invention.

FIG. 1 shows a schematic diagram of an exemplary plasma source hybrid plasma source 10 in accordance with aspects of the invention. The hybrid plasma source 10 includes a tube 15 defining an interior volume 17 in which a plasma discharge is produced using a combination of a helicon system and an ECR system. In embodiments, a helicon discharge is produced by an antenna 20 that is wound around the tube to transmit radio-frequency (RF) power into the plasma gas. At one end of the tube 15, a microwave source 25 is fixed to transmit microwave power into the tube end. In this manner, two types of power transmission are combined to produce a plasma in the tube 15. Specifically, radio frequency radiation emitted by the RF antenna 20 and microwave energy emitted by the microwave source 25 combine to excite a gas in the tube 15 to produce a plasma.

The RF antenna 20 includes electrodes 30 on or in proximity to the tube 15. In proximity to the tube 15 means that the electrodes 30 are located such that radio frequency radiation emitted by the electrodes 30 affects the gas inside the tube 15 to form a plasma. The electrodes 30 may be on (physically contacting the interior or exterior) of the tube, or may be spaced apart from the tube 15. In preferred embodiments, the electrodes 30 are arranged on the exterior surface of the tube 15. The electrodes 30 may comprise one or more windings of electrically conductive material that encircle a portion of the tube 15. As but one example, the electrodes 30 may comprise windings of hollow copper tubing that are wrapped tightly around the exterior surface of the tube 15, although the invention is not limited to this particular type of antenna and other types and configurations of radio frequency antennas may be used. The antenna 20 may include a connection to ground 33.

An RF source 35 is operatively connected to supply power to the electrodes 30 of the RF antenna 20. In embodiments, the RF source 35 is a 13.56 MHz radio frequency source with a power of about 200 W to 3000 W. Implementations are not limited to this particular type of RF source and other types and configurations of RF source, including different frequency and/or power, may be used.

With continued reference to FIG. 1, a microwave source 25 is arranged at one end of the tube 15 to transmit microwave energy into the tube 15 to produce plasma. In embodiments, the microwave source 25 includes a microwave power source 40, such as a magnetron, which generates a microwave. The microwave source 25 may include a circulator 45 and a load 50 connected to the microwave power source 40. The circulator 45 and load 50 protect the microwave power source 40 from reflected power by the circulator 45 separating a reflected microwave and directing the reflected microwave to the load 50 which absorbs the reflected microwave. The microwave source 25 may include a stub tuner 55 and a horn 60. The horn 60 is between the microwave power source 40 and the tube 15 and functions as a waveguide or antenna that shapes and directs a beam of microwave energy from the microwave power source 40 into the interior cavity of the tube 15. The horn 60 may be a conical horn, pyramidal horn, or any other suitable shape. The stub tuner 55 is structured and arranged to match the impedance of the microwave power source 40 to the plasma (load) inside the tube 15. The stub tuner 55 may include any desired number of stubs 65, such as three, which may be adjusted as is understood in the art for impedance matching.

In embodiments, the microwave power source 40 is a 2.45 GHz magnetron with a 2000 W peak power. However, other configurations may be used for the microwave power source 40.

Still referring to FIG. 1, a magnet array 70 is positioned on or in proximity to the tube 15. The magnet array 70 includes one or more magnets 75 located in spatial relation to the tube 15 such that a magnetic field generated by the one or more magnets 75 extends into the interior 17 of the tube 15 and affects the plasma therein. In embodiments, the magnets 75 are permanent magnets, rather than electromagnets which can require a larger power supply and active cooling. The permanent magnets 75 may be composed of any suitable materials, including but not limited to: ceramic magnets, Neodymium Iron Boron (NdFeB), samarium-cobalt (SamCo), alnico, barium ferrite, strontium ferrite, etc.

In accordance with aspects of the invention, the magnets 75 are structured and arranged around the tube 15 to create a magnetic field near the interior walls of the tube 15 to repel ions away from the interior walls of the tube 15. In this manner, the magnetic field directs ions toward the center of the chamber defined by the tube 15 and minimizes the number of ions that impinge upon the interior walls of the tube 15, i.e., urges the plasma generated inside the tube 15 away from the interior walls of the tube 15. The magnetic field may be used to generate constructive resonant field inside the tube 15, e.g., for electron cyclotron resonance. In embodiments, the magnet array 70 is structured and arranged to produce a magnetic field of between 875 Gauss and 1000 Gauss, although other field strengths may be used. In a particular exemplary embodiment shown in FIG. 2, the magnet array 70 includes two rings 77a, 77b. Each ring 77a, 77b includes eight permanent magnets 75 outside the tube 15 and radially spaced around a central longitudinal axis defined by the tube 15.

Still referring to FIG. 1, the tube 15 may comprise any material suitable for plasma generation. For example, the tube 15 may be a quartz tube or other suitable material.

As depicted in FIG. 1, the hybrid plasma source 10 may also include a gas inlet 80 and a vacuum port 85 at an end of the tube 15 opposite the microwave source 25. In embodiments, the gas inlet 80 is fluidicially connected to a process gas source 90 and communicates process gas from the source 90 to the interior 17 of the tube 15. The process gas may be any desired neutral gas that is suitable for forming a plasma, including but not limited to: argon, chlorine, fluorine, oxygen, sulfur hexafluoride, or any other suitable gas or any suitable mixture of gases.

In embodiments, the vacuum port 85 is fluidicially connected to a vacuum source 95 for providing and maintaining a vacuum at the interior 17 of the tube 15. The vacuum source 95 may comprise any suitable system that provides a vacuum, such as a turbo pump. A valve 100, such as a gate valve or the like, may be connected inline between the vacuum port 85 and the vacuum source 95 to control the vacuum at the interior 17 of the tube 15.

The hybrid plasma source 10 described herein combines two plasma generation methods, i.e., Electron Cyclotron Resonance (ECR) and helicon wave technique, to generate plasma with very high density at relatively high pressure and low electron temperature. In a particular exemplary implementation, the hybrid plasma source 10 includes a 2.45 GHz and 2000 W peak microwave power source 40, a 13.56 MHz RF source 35 with a power of about 200 to 3000 W, and a magnetic field of between 875 Gauss and 1000 Gauss, and generates a plasma with a density on the order of $10^{13}$ cm$^{-3}$, at a pressure on the order of 100 mTorr, and an electron temperature on the order of 1 eV. In empirical testing, a highest plasma density was achieved by combining the ECR and helicon plasma sources together, i.e., higher plasma densities than are obtained using any single source (ECR or helicon) were achieved by combining two sources (ECR and helicon) to ionize the neutral gas.

In embodiments, the hybrid plasma source 10 includes a measurement system 110 that is configured to measure parameters of the plasma generated in the tube 15. The measured parameters may include, for example, plasma density and electron temperature. The measurement system 110 may include any suitable components for measuring these parameters and/or other parameters associated with the plasma. For example, the measurement system 110 may include a camera 115, such as a CCD (charge-coupled device) or ICCD (intensified CCD) camera that is directed at the tube 15 and receives light emitted by the plasma. The camera 115 may be tuned to receive UV, IR, and/or visible light bands. In a particular embodiment, the camera 115 is configured to receive light coming from a predefined observation plane in the plasma, wherein the observation plane is defined in accordance with the focal length of a lens unit of the camera 115.

The measurement system 110 may also include a light source 120 that is configured to excite the plasma in the tube 15 as part of the measurement process. For example, the light source 120 may comprise a laser beam that is shone into the plasma by a fiber optic cable. The laser beam may be configured at a particular wavelength to excite particular atoms in the plasma. In embodiments, the laser beam is aimed to intersect the predefined observation plane to which the camera 115 is focused. In this manner, light that is emitted as a result of the excitation by the laser beam is detected by the camera 115.

In embodiments, the camera 115 transmits detected data (e.g., intensity and/or spectral information of the plasma) to a computer 125. In embodiments, the computer 125 is a computer device that includes a memory, a processor, and program instructions stored in the memory that, when executed by the processor, cause the computer device to perform one or more measurement functions (i.e., determine plasma density and/or electron temperature based on the data transmitted by the camera 115).

Figure 2:
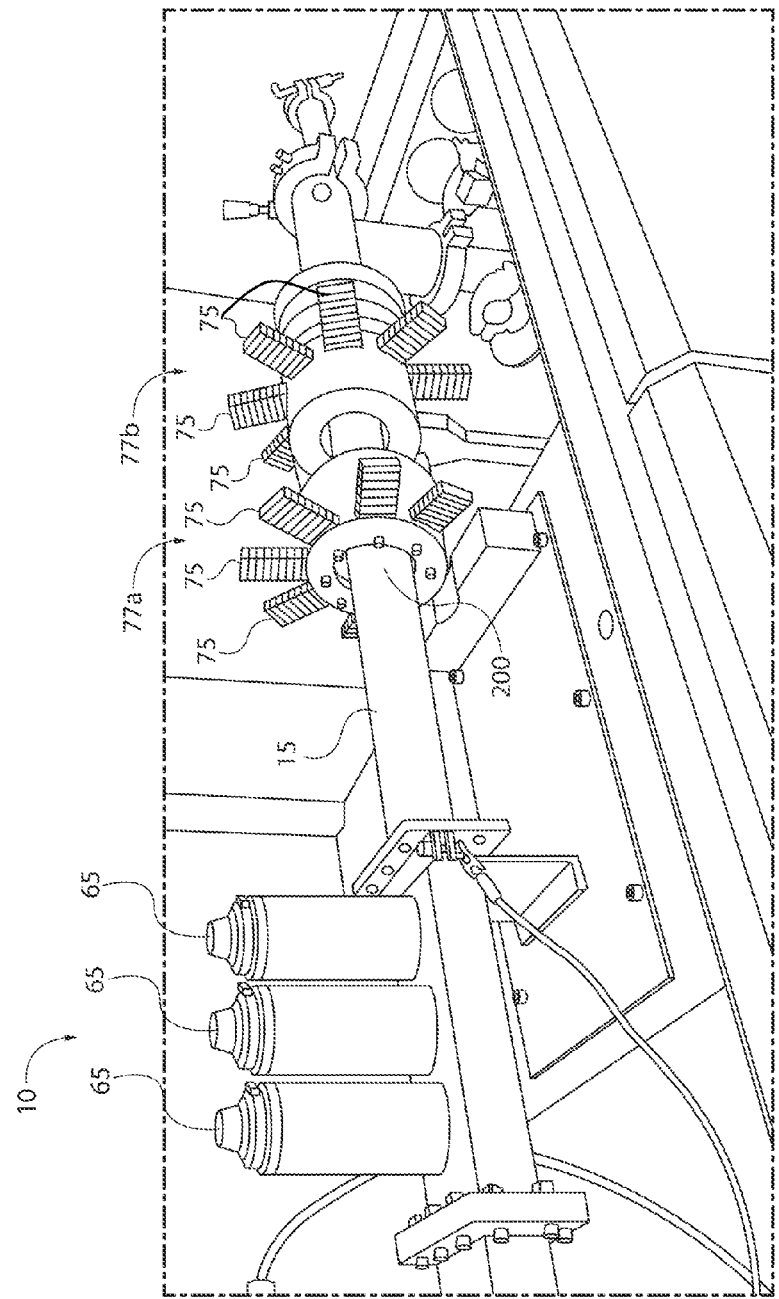
FIG. 2 shows an implementation of a hybrid plasma source in accordance with aspects of the invention.

FIG. 2 shows an implementation of a hybrid plasma source 10 in accordance with aspects of the invention. FIG. 2 shows the tube 15, stubs 65, and rings 77a and 77b including permanent magnets 75. FIG. 2 also shows a plasma 200 generated inside the tube 15.

The hybrid plasma source 10 as described herein may be used as a plasma source in semiconductor wafer fabrication, as it provides high density fully ionized plasma at a relatively high pressure. The hybrid plasma source 10 may also be used in other plasma applications, such as focused ion applications, physics studies, etc. For example, the hybrid plasma source 10 may be used to generate laboratory plasma with very high density (e.g., on the order of $10^{15}$ $cm^{-3}$)

Aspects of the invention also include a method of manufacturing the hybrid plasma source 10. For example, aspects of the invention include manufacturing and/or assembling some or all of the components of the hybrid plasma source 10 as described herein. Further aspects of the invention include a method of generating a plasma using the hybrid plasma source 10. For example, aspects of the invention include using some or all of the components of the hybrid plasma source 10 to generate a plasma.

The foregoing examples have been provided for the purpose of explanation and should not be construed as limiting the present invention. While the present invention has been described with reference to an exemplary embodiment, changes may be made, within the purview of the appended claims, without departing from the scope and spirit of the present invention in its aspects. Also, although the present invention has been described herein with reference to particular materials and embodiments, the present invention is not intended to be limited to the particulars disclosed herein; rather, the present invention extends to all functionally equivalent structures, methods and uses, such as are within the scope of the appended claims.

What is claimed:

1. A system for generating a plasma, comprising:
a helicon plasma source and an electron cyclotron resonance (ECR) plasma source structured and arranged together to generate a plasma in a tube, wherein the ECR plasma source comprises: a microwave power source; a circulator; a load; a stub tuner; and a horn and wherein the microwave power source comprises a 2.45 GHz magnetron with 2000 W peak power; the circulator and the load are structured and arranged to protect the microwave power source from reflected microwaves; the stub tuner is structured and arranged to match an impedance of the microwave power source to the plasma inside the tube; and the horn is structured and arranged to shape and direct microwave power generated by the microwave power source into an interior cavity of the tube.

2. The system of claim 1, wherein the helicon plasma source comprises:
a radio-frequency (RF) source; and
an RF antenna.

3. The system of claim 2, wherein:
the RF source is a 13.56 MHz source having a power of between 200 and 3000 W; and
the RF antenna is wrapped around an exterior of the tube.

4. The system of claim 1, further comprising a magnet array positioned on or in proximity to the tube.

5. The system of claim 4, wherein the magnet array comprises at least one permanent magnet that generates a magnetic field that influences the plasma inside the tube.

6. The system of claim 5, wherein the at least one permanent magnet comprises:
a first ring of eight magnets axially spaced around an exterior of the tube at a first location along a length of the tube; and
a second ring of eight magnets axially spaced around the exterior of the tube at a second location along the length of the tube different than the first location.

7. The system of claim 5, wherein the magnetic field is between 875 and 1000 Gauss.

8. The system of claim 1, further comprising a gas inlet and a vacuum port at one end of the tube.

9. The system of claim 8, wherein the gas inlet is fluidically connected to a gas source that provides a neutral gas to an interior of the tube.

10. The system of claim 9, wherein the vacuum port is connected to a vacuum source that provides a vacuum to the interior of the tube.

11. The system of claim 10, wherein the ECR plasma source is arranged at a second end of the tube opposite the first end of the tube.

12. The system of claim 11, wherein the helicon plasma source is arranged at a middle portion of the tube between the first end and the second end.

13. The system of claim 1, further comprising a measurement system comprising:
a camera;
a light source; and
a computer.

14. The system of claim 13, wherein:
the light source is configured to excite atoms in the plasma;
the camera is configured to detect optical emission of the plasma based on the exciting; and
the computer is configured to determine density of the plasma and/or electron temperature of the plasma based on the optical emission detected by the camera.

15. A system for generating a plasma, comprising:
a helicon plasma source comprising an RF antenna wrapped around a tube and an RF source that provides energy to the RF antenna;
an electron cyclotron resonance (ECR) plasma source comprising a microwave power source, a circulator, a load, a stub tuner, and a horn arranged at a first end of the tube; and
a gas inlet and a vacuum port at a second end of the tube; and
a magnet array that generates a magnetic field inside the tube,
wherein:
the RF antenna is wrapped around a first middle portion of the tube between the first end and the second end;
the magnet array is at a second middle portion of the tube between the first end and the second end;
the gas inlet is fluidically connected to a gas source that provides a neutral gas to an interior of the tube;
the vacuum port is connected to a vacuum source that provides a vacuum to the interior of the tube;
plasma is generated from the neutral gas in the tube using energy from both the RF antenna and the microwave power source.

16. The system of claim 15, wherein:
the RF source is a 13.56 MHz source having a power of between 200 and 3000 W;

the microwave power source comprises a 2.45 GHz magnetron with 2000 W peak power;

the circulator and the load are structured and arranged to protect the microwave power source from reflected microwaves;

the stub tuner is structured and arranged to match an impedance of the microwave power source to the plasma inside the tube;

the horn is structured and arranged to shape and direct microwave power generated by the microwave power source into an interior cavity of the tube;

the magnet array comprises a first ring of eight permanent magnets axially spaced around an exterior of the tube at a first location along a length of the tube; and the magnet array comprises a second ring of eight permanent magnets axially spaced around the exterior of the tube at a second location along the length of the tube different than the first location.

17. A method of generating a plasma, comprising:

providing a helicon plasma source comprising RF antenna wrapped around a tube and an RF source that provides energy to the RF antenna;

providing an electron cyclotron resonance (ECR) plasma source comprising a microwave power source, a circulator, a load, a stub tuner, and a horn arranged at a first end of the tube;

providing a magnet array that generates a magnetic field inside the tube; and generating a plasma in the tube using energy from both the RF antenna and the microwave power source.

18. The method of claim 17, wherein:

the RF source is a 13.56 MHz source having a power of between 200 and 3000 W;

the microwave power source comprises a 2.45 GHz magnetron with 2000 W peak power;

the circulator and the load are structured and arranged to protect the microwave power source from reflected microwaves;

the stub tuner is structured and arranged to match an impedance of the microwave power source to the plasma inside the tube;

the horn is structured and arranged to shape and direct microwave power generated by the microwave power source into an interior cavity of the tube;

the magnet array comprises a first ring of eight permanent magnets axially spaced around an exterior of the tube at a first location along a length of the tube; and the magnet array comprises a second ring of eight permanent magnets axially spaced around the exterior of the tube at a second location along the length of the tube different than the first location.

\* \* \* \* \*